(12) United States Patent
Okumoto et al.

(10) Patent No.: US 11,435,638 B2
(45) Date of Patent: Sep. 6, 2022

(54) LIQUID CRYSTAL DISPLAY DEVICE

(71) Applicant: SAKAI DISPLAY PRODUCTS CORPORATION, Sakai (JP)

(72) Inventors: Yoshitaka Okumoto, Sakai (JP); Akihiro Yamamoto, Sakai (JP); Koji Hasegawa, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 17/275,625

(22) PCT Filed: Sep. 13, 2018

(86) PCT No.: PCT/JP2018/033958
§ 371 (c)(1),
(2) Date: Mar. 11, 2021

(87) PCT Pub. No.: WO2020/054017
PCT Pub. Date: Mar. 19, 2020

(65) Prior Publication Data
US 2022/0057663 A1  Feb. 24, 2022

(51) Int. Cl.
*G02F 1/1368* (2006.01)
*G02F 1/1343* (2006.01)
*H01L 29/786* (2006.01)

(52) U.S. Cl.
CPC ........ *G02F 1/1368* (2013.01); *G02F 1/13439* (2013.01); *G02F 1/134309* (2013.01); *H01L 29/78669* (2013.01); *H01L 29/78678* (2013.01)

(58) Field of Classification Search
None
See application file for complete search history.

(56) References Cited

U.S. PATENT DOCUMENTS

| 6,091,467 A | 7/2000 | Kubo et al. |
| 2001/0050368 A1* | 12/2001 | Moon ............ H01L 27/12 |
| | | 257/E27.111 |

(Continued)

FOREIGN PATENT DOCUMENTS

| JP | S62-66664 A | 3/1987 |
| JP | H10-20298 A | 1/1998 |
| KR | 10-2005-0070880 A | 7/2005 |

OTHER PUBLICATIONS

International Search Report of PCT/JP2018/033958.

*Primary Examiner* — Ryan Crockett
(74) *Attorney, Agent, or Firm* — ScienBiziP, P.C.

(57) ABSTRACT

This liquid crystal display apparatus is provided with: a TFT substrate comprising a thin film transistor and a pixel electrode connected to the thin film transistor; and a counter substrate comprising a common electrode that faces the pixel electrode via a liquid crystal layer. The thin film transistor comprises: a semiconductor layer deposited over a gate electrode via a gate insulating layer, while having a planar shape that has a first side and a second side each overlapping the gate electrode in plan view; and a first electrode which is connected to the pixel electrode and a second electrode which faces the first electrode, said first and second electrodes being formed on the semiconductor layer. The first side and the second side of the semiconductor layer are adjacent to each other at a predetermined angle; and the first electrode at least partially covers the first side and the second side.

12 Claims, 7 Drawing Sheets

(56) References Cited

U.S. PATENT DOCUMENTS

| | | | | |
|---|---|---|---|---|
| 2001/0052951 | A1* | 12/2001 | Ashizawa | G02F 1/1368 349/43 |
| 2013/0048999 | A1* | 2/2013 | Okazaki | G02F 1/1368 257/E33.053 |
| 2014/0036531 | A1* | 2/2014 | Kim | G02B 6/0038 362/607 |
| 2014/0232711 | A1* | 8/2014 | Park | G06T 5/003 345/212 |
| 2015/0036082 | A1* | 2/2015 | Cho | G02F 1/133536 349/96 |
| 2017/0352765 | A1* | 12/2017 | Imai | H01L 29/7869 |
| 2018/0259704 | A1* | 9/2018 | Baek | G02B 6/0083 |
| 2018/0329242 | A1* | 11/2018 | Kitagawa | H01L 27/1225 |

\* cited by examiner

LIQUID CRYSTAL DISPLAY DEVICE

TECHNICAL FIELD

The invention relates to a liquid crystal display apparatus.

BACKGROUND ART

A liquid crystal display apparatus comprises two substrates that hold therebetween a liquid crystal layer comprising liquid crystal molecules, and on one of the two substrates (a TFT substrate), a pixel circuit to apply a voltage to an electrode (a pixel electrode) of each of a plurality of pixels lined up in a matrix is formed. Moreover, a common electrode facing the pixel electrode with the liquid crystal layer being sandwiched therebetween is formed on the other substrate (a counter substrate). Alignment of the liquid crystal molecules in the liquid crystal layer changes for each of the pixels in accordance with the difference in electric potential between the pixel electrode and the common electrode, and thereby, a desired image is displayed on a display screen. The pixel circuit is composed primarily of thin-film transistors (TFTs), and the application state of the voltage to the pixel electrode is switched by switching a TFT between ON state and OFF state. As disclosed in Patent document 1, for example, a TFT comprises a gate electrode formed on the surface of a glass plate; a semiconductor layer formed over the gate electrode via an insulating layer; and a source electrode and a drain electrode each formed on the semiconductor layer. The TFT in Patent document 1 comprises the semiconductor layer formed inside the gate electrode in planar view; and the drain electrode and the source electrode formed over the semiconductor layer so as to face each other. The drain electrode is connected to a pixel electrode of a liquid crystal display apparatus.

Figure 7:
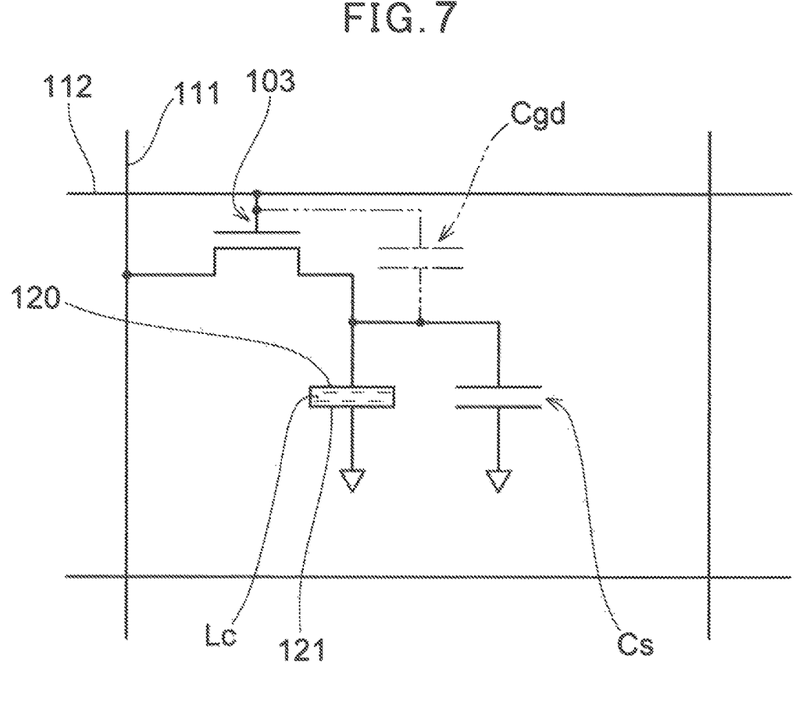
FIG. 7 shows a circuit diagram showing one example of a pixel circuit of the liquid crystal display apparatus.

One example of the pixel circuit of the liquid crystal display apparatus, together with a liquid crystal layer LC being schematically shown and a pixel electrode 120, is shown in FIG. 7. In FIG. 7, the pixel circuit comprises a TFT 103, the source of the TFT 103 is connected to a data bus line (source bus line) 111, the gate thereof is connected to a scan bus line (gate bus line) 112, and the drain thereof is connected to the pixel electrode 120. Moreover, an auxiliary capacitance Cs is formed, in electrically parallel to the liquid crystal layer LC. When the TFT 103 is brought to be in an ON state in accordance with the voltage of the scan bus line 112, the voltage based on image data is applied to the pixel electrode 120 from the data bus line 111, and an amount of electric charges according to the image data is accumulated in the auxiliary capacitance Cs and a capacitance that the liquid crystal layer LC has. Therefore, even when the TFT 103 switches to be in an OFF state, the electric potential of the pixel electrode 120 is maintained, and light from a light source transmits the liquid crystal layer LC in a light amount according to the electric potential difference between the pixel electrode 120 and the common electrode 121 for each of the pixels.

PRIOR ART DOCUMENT

Patent Document

Patent Document 1: JPH10-020298 A

SUMMARY OF THE INVENTION

Problem to be Solved by the Invention

Figure 8:
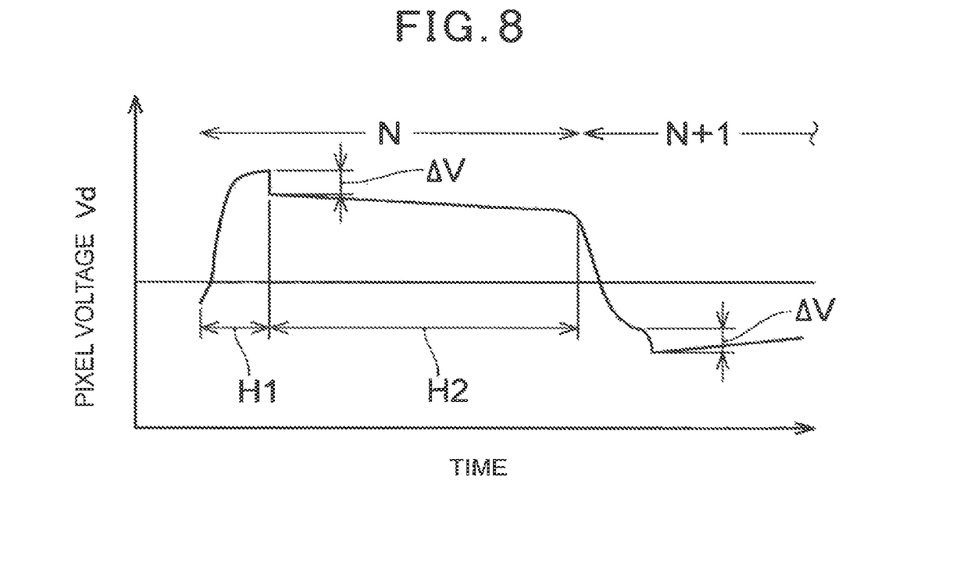
FIG. 8 shows the change in pixel voltage of the liquid crystal display apparatus.

However, as shown in FIG. 7, a parasitic capacitance Cgd is present between the gate and the drain of the TFT 103 because of the structure of the TFT. Therefore, when the TFT 103 is brought to be in the OFF state, some of the electric charges accumulated in the auxiliary capacitance Cs is pulled into the parasitic capacitance Cgd in accordance with the magnitude of the parasitic capacitance Cgd. FIG. 8 shows the change in the electric potential (a pixel voltage Vd) of the pixel electrode 120 in two frames (N frame and N+1 frame) during frame reverse driving. As shown in FIG. 8, when the TFT 103 switches from being in an ON state (H1 interval) to being in an OFF state (H2 interval), the pixel voltage Vd is reduced by a voltage (pull-in voltage or feedthrough voltage) ΔV according to the amount of electric charges pulled into the parasitic capacitance Cgd. Therefore, due to variations in the parasitic capacitance value, the original luminance based on the image data cannot be obtained in each of the pixels, possibly causing an occurrence of display non-uniformity such as luminance non-uniformity or color non-uniformity in the screen of the liquid crystal display apparatus to cause the display quality to deteriorate. While it is possible to correct the image data, taking into account fluctuations caused by the pull-in voltage ΔV, the magnitude of the parasitic capacitance Cgd can fluctuate for each of liquid crystal display apparatuses and for each of the pixels, so that it is difficult to appropriately correct image data for all the pixels all the time.

Then, an object of the invention is to provide a liquid crystal display apparatus having little deterioration in display quality due to variations in a parasitic capacitance of a TFT for driving pixels.

Means to Solve the Problem

A liquid crystal display apparatus according to one Embodiment of the invention comprises: a TFT substrate comprising a thin-film transistor, and a pixel electrode connected to the thin-film transistor; and a counter substrate comprising a common electrode facing the pixel electrode via a liquid crystal layer, wherein the thin-film transistor comprises: a semiconductor layer being deposited over a gate electrode via a gate insulating layer and having a planar shape comprising a first side and a second side, wherein each of the first side and the second side overlaps the gate electrode in planar view; and a first electrode connected to the pixel electrode, and a second electrode facing the first electrode, wherein each of the first electrode and the second electrode is formed over the semiconductor layer; the first side and the second side are adjacent to each other at a predetermined angle; and the first electrode at least partially covers each of the first side and the second side.

Effects of the Invention

An Embodiment of the invention makes it possible to reduce deterioration in display quality due to variations in a parasitic capacitance of a TFT configuring a pixel circuit in a liquid crystal display apparatus.

EMBODIMENT FOR CARRYING OUT THE INVENTION

The inventors have arduously carried out studies to reduce display non-uniformity caused by a parasitic capacitance of a TFT that drives a pixel. Then, the inventors have found that display non-uniformity could be suppressed by forming a semiconductor layer and an electrode (for example, a drain electrode) connected to a pixel electrode such that they mutually overlap appropriately. On this point, explanations will be given with reference to FIG. 9 showing a plan view of a TFT 103 being one example of a TFT of a liquid crystal display apparatus according to the conventional art.

The TFT 103 comprises a gate electrode 104 formed over a base substrate (not shown) such as a glass plate; a semiconductor layer 106 formed over the gate electrode 104 via a gate insulating layer (not shown), the semiconductor layer 106 being formed inside the gate electrode 104 in planar view; and a drain electrode 107 and a source electrode 108 being formed over the semiconductor layer 106 so as to face each other. The drain electrode 107 is connected to a pixel electrode not shown. A region given a reference numeral. Ch in the semiconductor layer 106, which is sandwiched between the drain electrode 107 and the source electrode 108, indicates a channel formed in the semiconductor layer 106.

Figure 9:
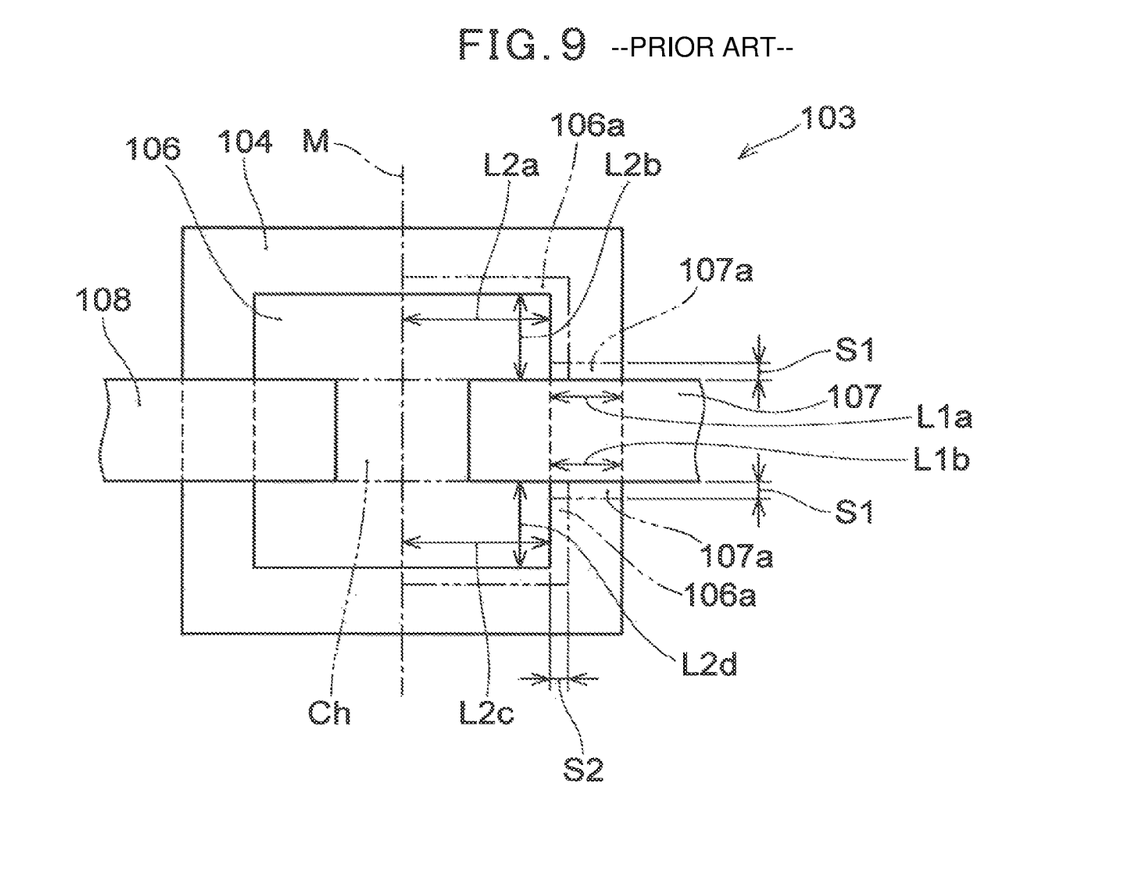
FIG. 9 shows a plan view of one example of the TFT of the liquid crystal display apparatus according to the conventional art.

Generally, in a case that a TFT to drive a pixel of a liquid crystal display apparatus is configured as that of the bottom gate type, such as in an example in FIG. 9, the semiconductor layer 106 is formed inside the gate electrode 104 in planar view. This makes it possible to prevent a channel from being excited to the semiconductor layer 106 by light transmitting a base substrate not shown. In addition, the gate electrode 104 is larger than the semiconductor layer 106, so that, even a small pixel can be formed relatively easily, making it possible to cope with high definition of the liquid crystal display apparatus. Moreover, forming of a U-shaped source electrode having been widely used conventionally tends to be difficult as the pixel is reduced in size, so that the configuration in which the drain electrode 107 and the source electrode 108 face each other along one direction as in the example in FIG. 9 is being used. However, the inventors have found that, with the configuration such as the example in FIG. 9, a parasitic capacitance Cgd (see FIG. 7) could vary due to a factor not seen problematic in the configuration using the U-shaped source electrode.

In the TFT 103 having the configuration as in the example in FIG. 9, the magnitude of the parasitic capacitance Cgd is determined based on the area of a portion of the drain electrode 107, the portion overlapping the gate electrode 104. Here, when the TFT 103 is in the ON state, the carrier is excited in the semiconductor layer 106, so that the semiconductor layer 106 also functions as a conductor. In other words, in the semiconductor layer 106, a region (also called "a second region" below) toward the drain electrode 107 with respect to an intermediate line M passing through the middle between the drain electrode 107 and the source electrode 108 is considered to act in the same manner as the drain electrode 107 with respect to the formation of the parasitic capacitance Cgd. Therefore, it is considered that the parasitic capacitance Cgd when the TFT 103 is in the ON state be determined based on the total of the area of the second region of the semiconductor layer 106 and the area of a region of the drain electrode 107 (also called "a first region" below) which overlaps the gate electrode 104 with the exception of a part overlapping the semiconductor layer 106. Therefore, variations of the parasitic capacitance Cgd, or, in other words, variations of a pull-in voltage ΔV (see FIG. 8) in a plurality of TFTs 103 occur in association with variations in the plurality of TFTs 103 in each of the area of the second region of the semiconductor layer 106 and the area of the first region of the drain electrode 107.

In FIG. 9, an example of an expanded portion being newly occupied when the second region of the semiconductor layer 106 and the first region of the drain electrode 107 fluctuate in the expansion direction is shown with chain double-dashed lines and reference numerals 106a, 107a. As evident from FIG. 9, in a case that the drain electrode 107 overlaps only one side of four sides of the semiconductor layer 106 having a rectangular planar shape, an expanded portion 106a of the semiconductor layer 106 is much larger than an expanded portion 107a of the drain electrode 107. While not shown, even in a case that the semiconductor layer 106 and the drain electrode 107 vary in the direction such that they are reduced in size, the magnitude relationship between each of the reduced portions is similar to the magnitude relationship between each of the expanded portions shown in FIG. 9.

Variations in the plurality of TFTs 103 in the area of the second region of the semiconductor layer 106 and in the area of the first region of the drain electrode 107 occur, for example, due to the deviation of the edge of an exposure portion and the deviation of the edge of an etching portion at the time of forming them using a photolithography technique. In the process of forming the semiconductor layer 106 and the process of forming the drain electrode 107, the variations occur independently from each other. In a case that the expanded portion 106a of the semiconductor layer 106 is much larger than the expanded portion 107a of the drain electrode 107 as in the example in FIG. 9 when the second region of the semiconductor layer 106 and the first region of the drain electrode 107 fluctuate in the expansion direction, the parasitic capacitance Cgd would widely fluctuate even when merely the second region of the semiconductor layer 106 fluctuates. While both of the area of the second region of the semiconductor layer 106 and the area of the first region of the drain electrode 107 can vary, it is considered that there are more cases in which only either one thereof varies with respect thereto. Therefore, regardless of which one of the area of the second region of the semiconductor layer 106 and the area of the first region of the drain electrode 107 varies, forming the semiconductor layer 106 and the drain electrode 107 such that the fluctuation amount of the areas is brought to be within a certain range makes it possible, for example, to reduce an occurrence of visually recognizable display non-uniformity.

Moreover, one of the first area of the drain electrode 107 and the second area of the semiconductor layer 106 can fluctuate in the expansion direction or the reduction direction, while the other thereof can fluctuate in the reverse direction thereof. Therefore, by forming both of the second area of the semiconductor layer 106 and the first area of the drain electrode 107 such that their respective fluctuation amounts are brought to be closer to each other as much as possible, it is possible to cancel the effect on the parasitic capacitance Cgd in a case that both areas fluctuate in respective directions being reverse of each other.

The area of the expanded portion 107a in a case that the first region of the drain electrode 107 fluctuates in the expansion direction is the product of the length L1 (=L1a+L1b) (also called "a first length" below) of a part of the outer edge of the drain electrode 107 and a displacement width S1 of the outer edge of the drain electrode 107, where the part of the outer edge is a part overlapping the gate electrode 104 not via the semiconductor layer 106. Then, the area of the expanded portion 106a in a case that the second region of the semiconductor layer 106 fluctuates in the expansion direction is the magnitude obtained by adding $2\times(S2)^2$ (the expanded area at two corners of the second region) to the product of the length L2 (=L2a+L2b+L2c+L2d) (also called "a second length" below) of a part of the outer edge of the second region of the semiconductor layer 106 and a displacement width S2 of the outer edge of the second region of the semiconductor layer 106, where the part of the outer edge is a part being not covered by the drain electrode 107. While the displacement width S1 and the displacement width S2 are not necessarily the same, it is considered that no large difference therebetween occur on the average. Therefore, by forming the drain electrode 107 so as to appropriately overlap the semiconductor layer 106 so that the difference between the first length L1 and the second length L2 is reduced, it is possible to bring the fluctuation amount of the first region of the drain electrode 107 and the fluctuation amount of the second region of the semiconductor layer 106 to be closer to each other and to suppress them. Therefore, an occurrence of a large fluctuation in the parasitic capacitance Cgd merely due to an occurrence of variations in either one of the area of the first region of the drain electrode 107 and the area of the second region of the semiconductor layer 106 can be reduced and, for example, an occurrence of visually recognized display non-uniformity can be reduced. Moreover, by setting the first length L1 of the drain electrode 107 and the second length L2 of the semiconductor layer 106 to be substantially the same, it is possible to also make the fluctuation of the parasitic capacitance Cgd and display non-uniformity extremely small in a case that the first region of the drain electrode 107 and the second region of the semiconductor layer 106 fluctuate in mutually reverse directions as described previously.

As a result of having arduously carried out studies, the inventors have obtained knowledge as described above. Below, with reference to the drawings, a liquid crystal display apparatus according to Embodiments based on the above-mentioned knowledge will be explained. The material and shape of each of the constituting elements, and the relative positional relationships thereof in each of the Embodiments explained below are merely exemplary except for those which are clearly limited. The liquid crystal display apparatus according to the invention is construed to be not limited thereto.

Embodiment 1

Figure 1:
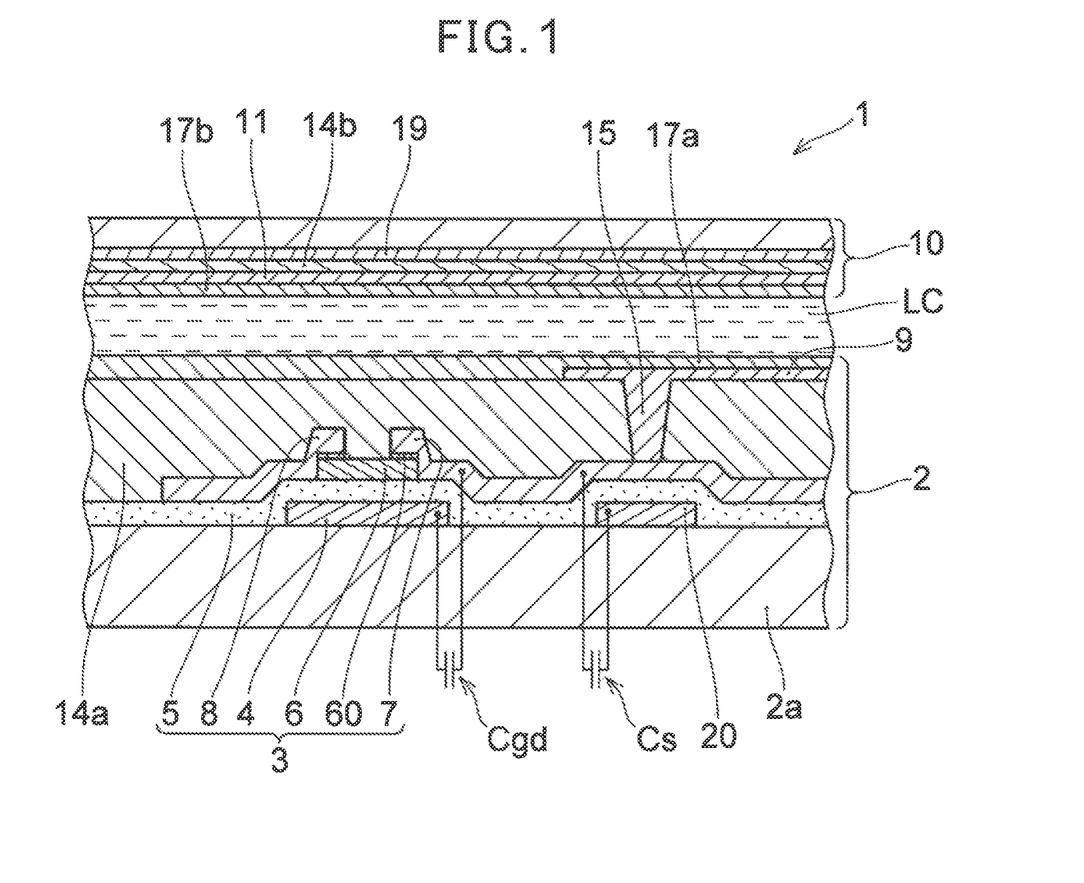
FIG. 1 shows one example of a cross section along a cutting line passing through a TFT of a liquid crystal display apparatus according to Embodiment 1 of the invention.
Figure 2:
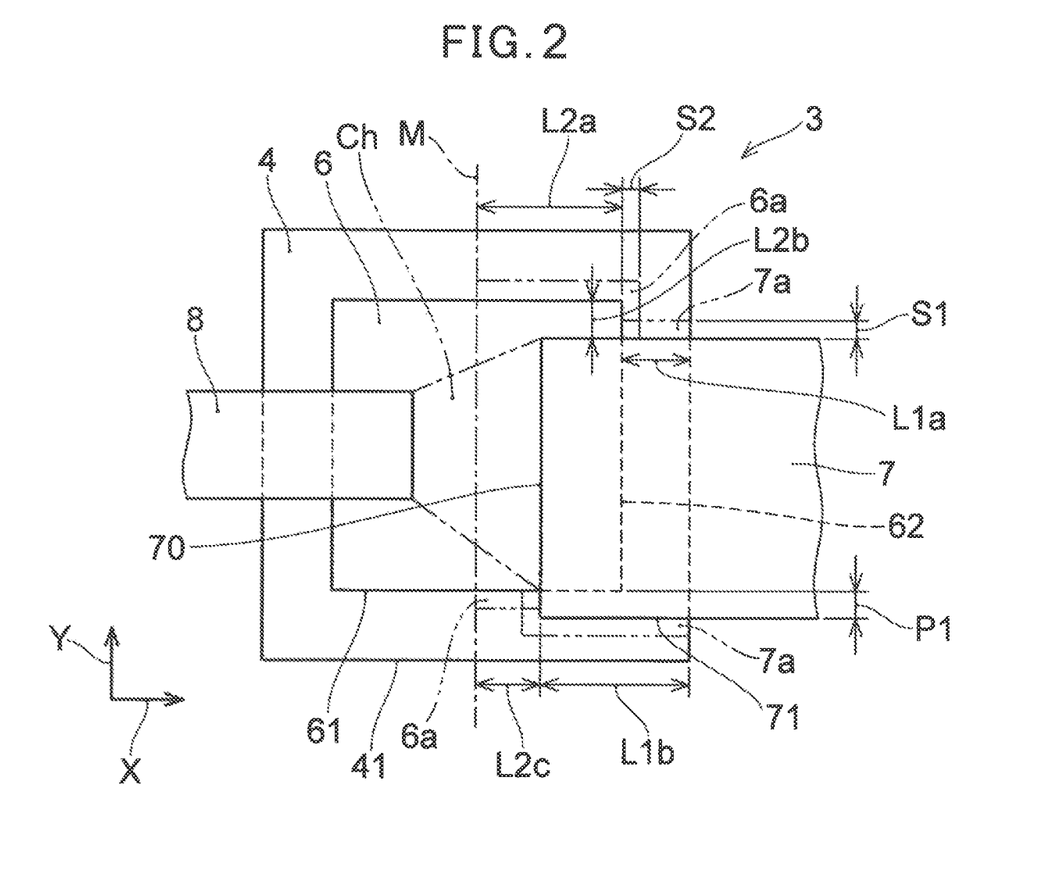
FIG. 2 shows a plan view of one example of the TFT of the liquid crystal display apparatus according to Embodiment 1.

FIG. 1 shows a liquid crystal display apparatus 1 according to Embodiment 1 with a cross-sectional view along a cutting line passing through a TFT 3 in a certain pixel. FIG. 2 shows a plan view of one example of the TFT 3 of the liquid crystal display apparatus according to the Embodiment. As shown in FIG. 1, a liquid crystal display apparatus 1 comprises a TFT substrate 2 comprising a thin-film transistor (TFT) 3, and a pixel electrode 9 connected to the TFT 3; and a counter substrate 10 comprising a common electrode 11 facing the pixel electrode 9 via a liquid crystal layer LC. The TFT 3 comprises a gate electrode 4 formed on a base substrate 2a; a semiconductor layer 6 deposited over the gate electrode 4 via a gate insulating layer 5 to cover the gate electrode 4; and a first electrode 7, and a second electrode 8 opposing the first electrode 7, each of the first electrode 7 and the second electrode 8 being formed over the semiconductor layer 6. Moreover, a contact layer 60 is formed out of a semiconductor having a high impurities concentration, between the semiconductor layer 6, and the first electrode 7 and the second electrode 8. A planarizing layer 14a is formed over the TFT 3, while a pixel electrode 9 is formed on the surface of the planarizing layer 14a. The first electrode 7 is connected to the pixel electrode 9 via a via contact 15. Moreover, in FIG. 1, a capacitance electrode 20 being lined up with the gate electrode 4 is formed on the base substrate 2a, and an auxiliary capacitance Cs is formed between the capacitance electrode 20, and the first electrode 7 and the pixel electrode 9.

A first alignment layer 17a is formed over the planarizing layer 14a and the pixel electrode 9, and the liquid crystal layer LC is formed between the first alignment layer 17a and a second alignment layer 17b by injecting a nematic liquid crystal therebetween. On a surface of the counter substrate 10 facing the TFT substrate 2, the second alignment layer 17b is deposited together with a color filter 19, a planarizing layer 14b, and the common electrode 11. The counter substrate 10 is arranged at a predetermined interval with the TFT substrate 2 by a spacer not shown. Moreover, while not shown, a polarizing plate can be provided on a surface of each of the TFT substrate 2 and the counter substrate 10 oriented in a direction reverse the liquid crystal layer LC, and, in a case that the liquid crystal display apparatus 1 is of the transmissive type, a light source configured by an LED, or a light guide plate (neither thereof shown) is provided in a manner facing the polarizing plate provided on the TFT substrate 2. Each of the constituting elements such as the pixel electrode 9, the first and second alignment layers 17a, 17b, and the liquid crystal layer LC can have a general structure, so that detailed explanations therefor will be omitted.

One of the first electrode 7 and the second electrode 8 is a drain electrode, while the other thereof is a source electrode. Generally, the two electrodes of the TFT, which are formed over the semiconductor layer, have mutually the same function because of the structure thereof, so that the TFT 3 can function appropriately regardless of which of the source electrode and the drain electrode is connected to the pixel electrode 9. Below, the liquid crystal display apparatus according to the Embodiment is explained assuming that an electrode connected to the pixel electrode 9 is the drain electrode. Therefore, the first electrode 7 and the second electrode 8 are also called the drain electrode and the source electrode, respectively.

As shown in FIG. 2, the semiconductor layer 6 is formed inside the gate electrode 4 in planar view and has a planar shape comprising a first side 61 and a second side 62, each of which overlaps the gate electrode 4 in planar view. The first side 61 and the second side 62 are adjacent to each other at a predetermined angle. A channel Ch is formed, in the semiconductor layer 6, at the time of applying a predetermined-ON voltage to the gate electrode 4. In the example in FIG. 2, the semiconductor layer 6 has a rectangular, or, specifically, a substantially square planar shape, and the first side 61 and the second side 62 form a substantially right angle and are mutually adjacent with one vertex sandwiched therebetween. Then, the first electrode 7 at least partially covers each of the first side 61 and the second side 62. In other words, the first electrode 7 is formed such that an outer edge (a first outer side 71) thereof is located outside the semiconductor layer 6 with respect to the first side 61, where the outer edge is an edge, proximate to the first side 61, of two outer edges of the first electrode 7, and the two outer edges are edges that do not cross the first side 61 of the semiconductor layer 6. As a result, each of the first side 61 and the second side 62 is partially covered by the first electrode 7. In the same manner as the intermediate line M in FIG. 9 previously-referred to, a line M in FIG. 2 indicates an intermediate line being defined in the middle between the first electrode 7 and the second electrode 8.

In this way, according to the Embodiment, the first electrode 7 connected to the pixel electrode 9 (see FIG. 1) at least partially covers the first side 61 and the second side 62 of the semiconductor layer 6. Therefore, the difference between a first length L1(=L1$a$+L1$b$+P1) of the first electrode 7 and a second length L2(=L2$a$+L2$b$+L2$c$) of the semiconductor layer 6 can be reduced. Therefore, as described previously, variations in the plurality of TFTs 3 of the parasitic capacitance Cgd (see FIG. 1) between the drain electrode (first electrode 7) and the gate electrode 4 can be reduced, and display non-uniformity can be reduced. In the explanations above and below, unless particularly noted, "the length" is the designed (regular) length of the first electrode 7 and the semiconductor layer 6.

With the configuration, as in the TFT 103 according to the conventional art shown in FIG. 9, in which the drain electrode 107 overlaps only one side of the semiconductor layer 106, the first length L1 of the drain electrode 107 is only approximately twice the width of a margin portion of the gate electrode 104 that is not covered by the semiconductor layer 106, so that the first length is much less than the second length L2 of the semiconductor layer 106. Even when the width (the length in the up-down direction in FIG. 9) of the drain electrode 107 is increased to some extent, the first length L1 itself does not change. While the first length L1 of the drain electrode 107 can be increased by expanding the gate electrode 104 relative to the semiconductor layer 106, such an expansion is not preferable from the viewpoint of reducing the size of the pixel.

In contrast thereto, according to the Embodiment, the first electrode 7 connected to the pixel electrode 9 overlaps, not only the second side 62 of the semiconductor layer 6 that is substantially orthogonal to a facing direction of the first electrode 7 and the second electrode 8 (a first direction X), but also the first side 61. As a result, in the first direction X, the first length L1 of the first electrode 7 can be extended and also the second length L2 of the semiconductor layer 6 can be reduced. In other words, the first length L1 of the first electrode 7 can be brought to be longer than the conventional one and the second length. L2 of the semiconductor layer 6 can be brought to be shorter than the conventional one. Therefore, the fluctuation amount of the first region of the first electrode 7 (for example, the total sum of the expanded portion 7$a$ shown in FIG. 2) and the fluctuation amount of the second region of the semiconductor layer 6 (for example, the total sum of the expanded portion 6$a$ shown in FIG. 2) can be brought to be closer to each other. Moreover, the fluctuation amount of the second region of the semiconductor layer 6 can also be suppressed. Therefore, variations of the parasitic capacitance Cgd in the plurality of TFTs 3 can be reduced and display non-uniformity can be reduced.

The "planar view" means to view the liquid crystal display apparatus 1 with the line of sight parallel to the thickness direction of the TFT substrate 2. Moreover, "adjacent to each other at a predetermined angle" means that the first side 61 and the second side 62 of the semiconductor layer 6 are adjacent to each other with the corner of the planar shape of the semiconductor layer 6 being sandwiched between the first and second sides. In other words, the first side 61 and the second side 62 of the semiconductor layer 6 are not a pair of parallel opposite sides of the rectangular shape, for example, and the "predetermined angle" can be an arbitrary angle other than 0 and 180 degrees. Moreover, the corner sandwiched by the first side 61 and the second side 62 can be a vertex of a polygon as in the example in FIG. 2, or can be brought to be rounded such that it is chamfered.

In this way, the Embodiment makes it easier to bring the first length L1 of the first electrode 7 and the second length L2 of the semiconductor layer 6 closer to each other. Preferably, the first electrode 7 and the semiconductor layer 6 are formed such that the first length L1 of the first electrode 7 and the second length L2 of the semiconductor layer 6 are brought to be substantially equal. However, it is not necessary that these lengths be the same.

Moreover, in a case that the displacement width S1 of the first region of the first electrode 7 and the displacement width S2 of the second region of the semiconductor layer 6 can be estimated and are different from each other, the first length L1 of the first electrode 7 and the second length L2 of the semiconductor layer 6 can be the length based on the displacement width S1 and displacement width S2, respectively. For example, the first length L1 of the first electrode 7 and the second length L2 of the semiconductor layer 6 can be the lengths such that the ratio of the second length L2 of the semiconductor layer 6 to the first length L1 of the first electrode 7 is brought to be substantially equal to the ratio of the displacement width S1 to the displacement width S2.

In the example in FIG. 2, the first electrode 7 is drawn out externally from a region over the gate electrode 4 along the first direction X being the direction in which the first electrode 7 and the second electrode 8 face each other (the facing direction of the first electrode 7 and the second electrode 8), and is connected to the pixel electrode 9 (see FIG. 1). By drawing the first electrode 7 out along the first direction X, it is possible to connect the first electrode 7 and the pixel electrode 9 in a short path in a case that a point of connection (for example, a via contact 15 in the example in FIG. 1) to the pixel electrode 9 is located in the direction opposite to the second electrode 8. The second electrode 8 is also drawn out from the region over the gate electrode 4 along the first direction X and is connected to, for example, a data bus line not shown.

Moreover, in the example in FIG. 2, the first side 61 of the semiconductor layer 6 extends substantially parallel to the first direction X and also is substantially orthogonal to the second side 62. The semiconductor layer 6 and the first electrode 7 being rectangular can be laid out efficiently. The first electrode 7 covers, not the entire first side 61, but the first side 61 partially such that a predetermined interval is secured between the first electrode 7 and the second electrode 8.

Moreover, in the example in FIG. 2, the width of the first electrode 7 in the direction along the second side 62 of the semiconductor layer 6 (the second direction Y being orthogonal to the first direction X) is shorter than the length of the second side 62. Therefore, the fluctuation amount of the first region of the first electrode 7 can be prevented from becoming excessively large with respect to the fluctuation amount of the second region of the semiconductor layer 6. The width of the first electrode 7 in the second direction Y can be the same as the length of the second side 62, or can be longer than the length of the second side 62. The width of the first electrode 7 in the second direction Y is arbitrarily selected under the viewpoint of reducing variations of the parasitic capacitance Cgd.

Moreover, in the example in FIG. 2, the first electrode 7 has a planar shape comprising, in planar view, a first facing side 70 that faces the second electrode 8; and the first outer side 71 extending substantially parallel to the first side 61 of the semiconductor layer 6 from an end of the first facing side 70, where the end of the first facing side 70 is located outside the semiconductor layer 6. The first electrode 7 has a rectangular shape over the gate electrode 4, and comprises the first outer side 71 that is proximate, among the outer edges of the first electrode 7, to the first side 61 of the semiconductor layer 6 and extends substantially parallel to the first side 61. The first outer side 71 is positioned between the first side 61 of the semiconductor layer 6 and an outer edge 41 of the gate electrode 4 being proximate to the first side 61 of the semiconductor layer 6, and is located at a position overlapping the gate electrode 4 not via the semiconductor layer 6. In other words, the first outer side 71 is arranged outside the semiconductor layer 6 with respect to the first side 61 of the semiconductor layer 6.

At the time of manufacturing of the liquid crystal display apparatus 1, a relative positional deviation can also occur between the first electrode 7 and the semiconductor layer 6. When the first outer side 71 of the first electrode 7 is displaced to inside of the semiconductor layer 6 due to such a positional deviation, the configuration according to the Embodiment cannot be realized. Therefore, an interval P1 between the first outer side 71 of the first electrode 7 and the first side 61 of the semiconductor layer 6 is preferably brought to be greater than the maximum value of the relative positional deviation between the first electrode 7 and the semiconductor layer 6. However, excessively increasing the interval P1 causes the TFT 3 to increase in size, therefore, the interval P1 is preferably greater than the maximum value of the relative positional deviation between the first electrode 7 and the semiconductor layer 6 by approximately 0.5 µm. For example, the interval P1 between the first outer side 71 of the first electrode 7 and the first side 61 of the semiconductor layer 6 is greater than or equal to 1 µm and less than or equal to 2 µm, preferably 1.5 µm.

In the example in FIG. 2, the semiconductor layer 6 has a planar shape being substantially square. However, as the shape described below, the semiconductor layer 6 can have a different planar shape having at least the first side 61 and the second side 62. For example, the planar shape of the semiconductor layer 6 can be a polygon other than a quadrilateral. Even in that case, by at least partially covering the first side 61 and the second side 62 with the first electrode 7, it is possible to bring the fluctuation amount of the first region of the first electrode 7 and the fluctuation amount of the second region of the semiconductor layer 6 closer to each other compared to a case in which the first electrode 7 overlaps only one side of the semiconductor layer 6.

While the gate electrode 4 also has a planar shape being substantially square in the example in FIG. 2, the gate electrode 4 can be of a shape of a different polygon such as a rectangle, and the gate electrode 4 can have an arbitrary planar shape.

The gate electrode 4, the first electrode 7, and the second electrode 8 can be formed using titanium, aluminum, or a copper-titanium alloy, for example. The semiconductor layer 6 is formed using amorphous silicon, low-temperature polycrystalline silicon (LTPS), or a mixed crystal semiconductor, for example. Moreover, the gate insulating layer 5 is configured by silicon oxide ($SiO_2$) or silicon nitride ($SiN_x$).

Figure 3:
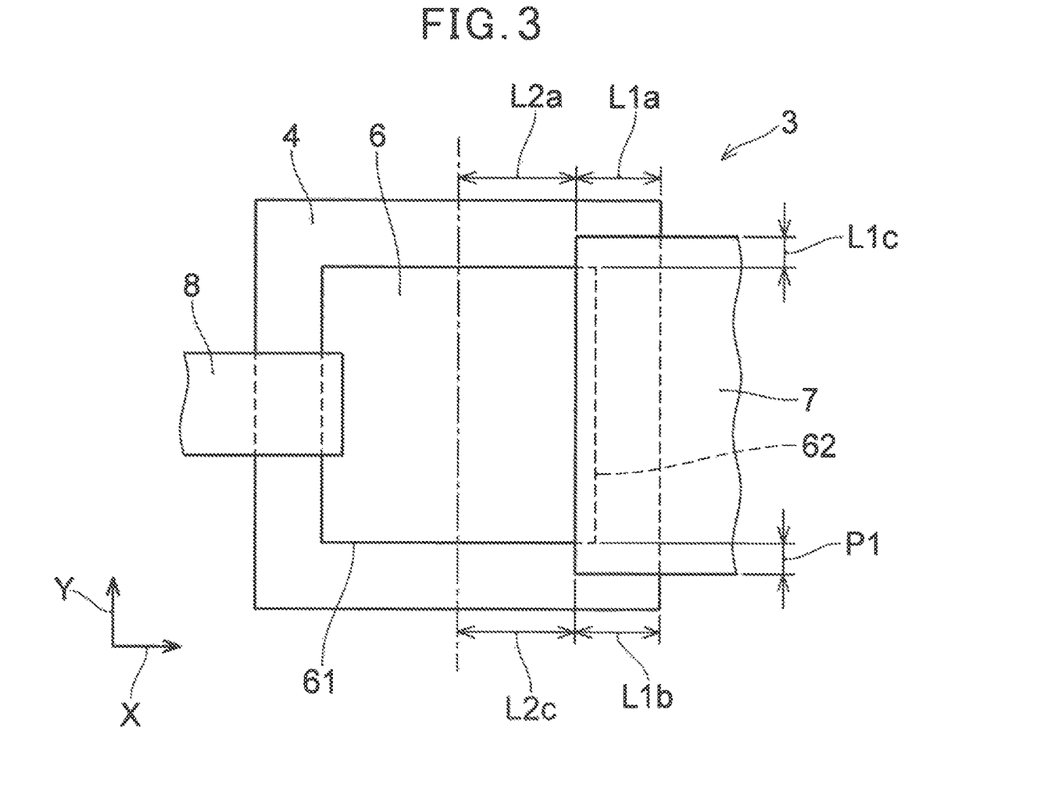
FIG. 3 shows a plan view of another example of the TFT of the liquid crystal display apparatus according to Embodiment 1.
Figure 4:
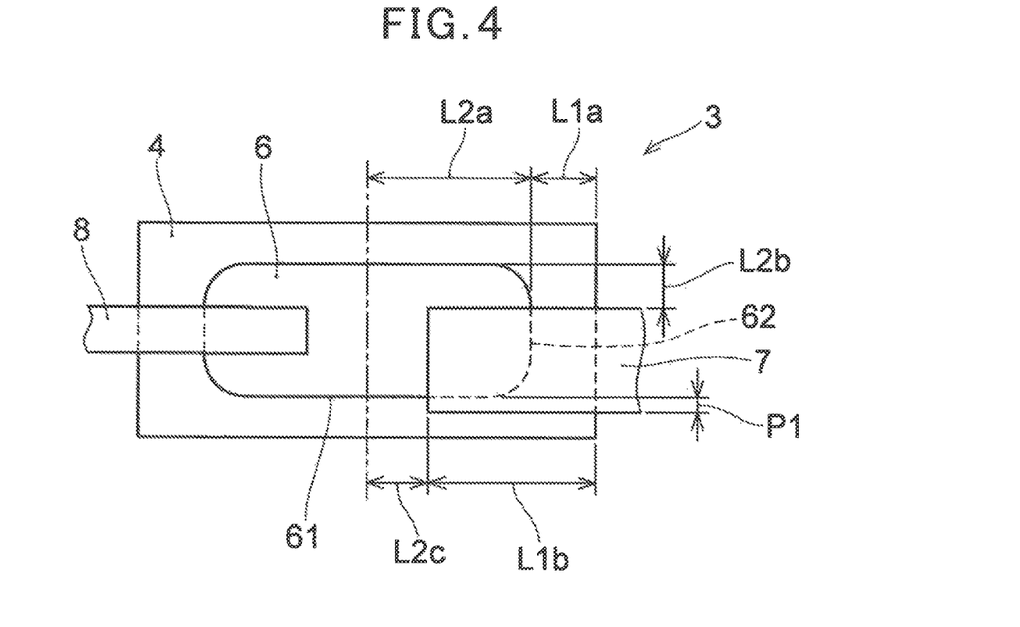
FIG. 4 shows a plan view of another example of the TFT of the liquid crystal display apparatus according to Embodiment 1.
Figure 5:
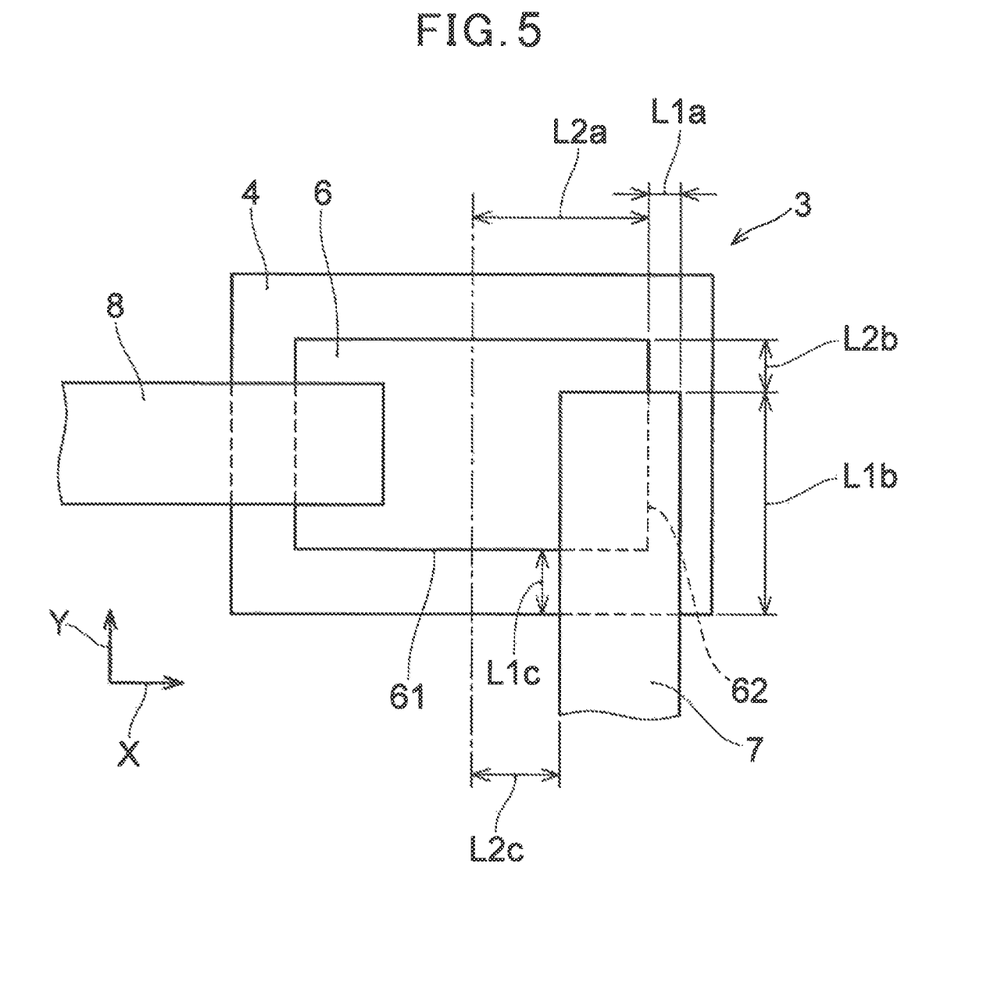
FIG. 5 shows a plan view of another example of the TFT of the liquid crystal display apparatus according to Embodiment 1.

Different examples of the TFT 3 of the liquid crystal display apparatus according to the Embodiment are shown in FIGS. 3 to 5, respectively. They will be explained in order with reference to each of the figures.

FIG. 3 shows an example in which the entire second side 62, of the semiconductor layer 6, along the second direction Y orthogonal to the first direction X being the facing direction of the first electrode 7 and the second electrode 8 is covered by the first electrode 7. The first electrode 7, as in the example in FIG. 3, can cover the entire second side 62 of the semiconductor layer 6. Therefore, the width of the first electrode 7 in the second direction Y can be greater than the second side 62 of the semiconductor layer 6. In other words, both of the two sides of the first electrode 7 which are substantially parallel to the first direction X can be located outside the semiconductor layer 6. For example, in a case that the first electrode 7 cannot be formed to be long along the first direction X, the first length L1 of the first electrode 7 can be brought closer to a desired length by covering the entire second side 62 of the semiconductor layer 6 in this way. Also in the example in FIG. 3, the first length L1(=L1a+L1b+L1c+P1) of the first electrode 7 and the second length. L2(L2a+L2c) of the semiconductor layer 6 are also brought to be substantially the same.

In the example in FIG. 4, the semiconductor layer 6 has a shape in which four corners of a rectangle in planar view is rounded by chamfering. However, also in the example in FIG. 4, the semiconductor layer 6 has the first side 61 and the second side 62 with a chamfered corner being sandwiched therebetween, and the first side 61 and the second side 62 of the semiconductor layer 6 are partially covered by the first electrode 7. In this way, the first length L1(=L1a+L1b+P1) of the first electrode 7 and the second length L2(L2a+L2b+L2c−α) of the semiconductor layer 6 can be brought to be closer to each other, and it is possible to suppress variations of the parasitic capacitance Cgd (see FIG. 1). α is the length corresponding to reduction of the length L2 due to rounding of the corner.

Moreover, in the example in FIG. 5, the first electrode 7 is drawn out from the above of the gate electrode 4 along the second direction Y being substantially orthogonal to the first direction X being the facing direction of the first electrode 7 and the second electrode 8. For example, in a case that the point of connection to the pixel electrode 9 (see FIG. 1) is in a lower portion or an upper portion in FIG. 5, by drawing the first electrode 7 out from the above of the gate electrode 4 along the second direction Y, it is possible to connect the first electrode 7 and the pixel electrode 9 in a short path. Also in the example in FIG. 5, the first and second sides 61, 62 of the semiconductor layer 6 are partially covered by the first electrode 7. Therefore, the first length L1(=L1a+L1b+L1c) of the first electrode 7 and the second length L2(L2a+L2b+L2c) of the semiconductor layer 6 can be brought to be closer to each other, and it is possible to suppress variations of the parasitic capacitance Cgd (see FIG. 1).

The shape and magnitude of the second electrode 8, and direction along which the second electrode 8 is drawn out from the above of the gate electrode 4 are not limited to the examples shown in FIGS. 2 to 5, so that the second electrode 8 can have the shape and magnitude being arbitrary and can be drawn out from the above of the gate electrode 4 along an arbitrary direction.

Embodiment 2

Figure 6A:
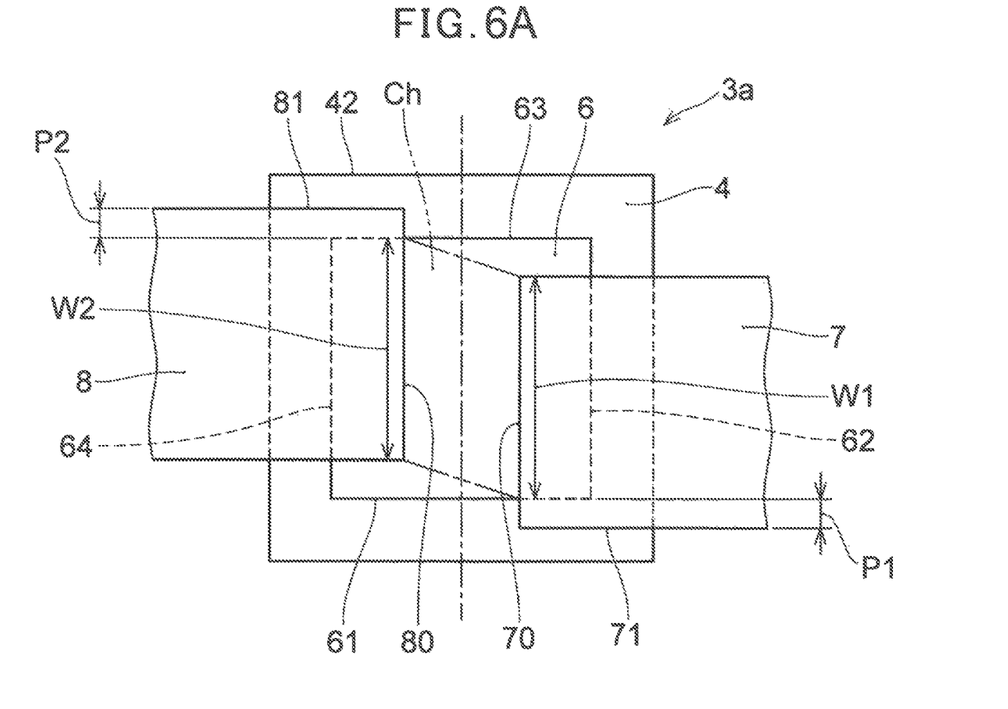
FIG. 6A shows a plan view of one example of the TFT of the liquid crystal display apparatus according to Embodiment 2 of the invention.
Figure 6B:
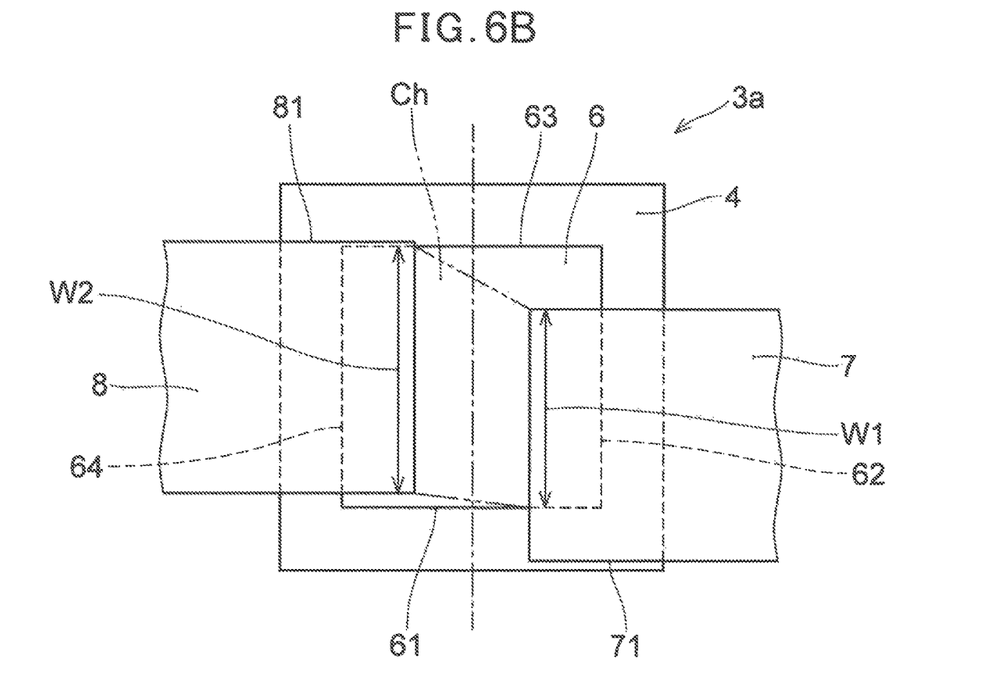
FIG. 6B shows a plan view showing that the area of a channel of the TFT in the example in FIG. 6A does not fluctuate substantially.
Figure 6C:
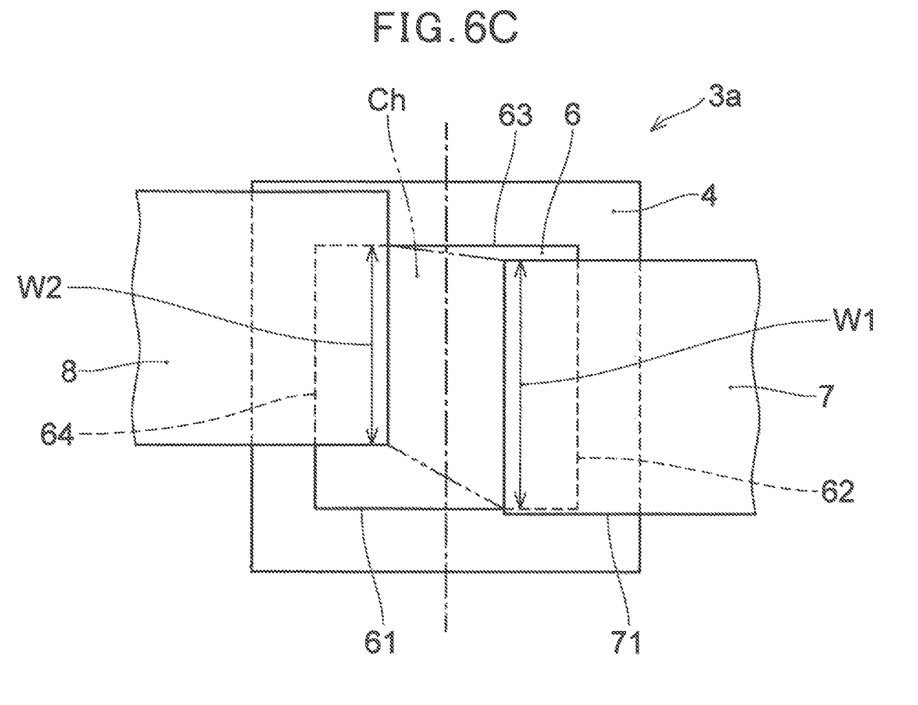
FIG. 6C shows a plan view showing that the area of the channel of the TFT in the example in FIG. 6A does not fluctuate substantially.

Next, explanations on a TFT 3a of the liquid crystal display apparatus according to Embodiment 2 will be given with reference to FIGS. 6A to 6C, each of which shows a plan view of the TFT 3a. Constituting elements other than the TFT 3a of the liquid crystal display apparatus according to Embodiment 2 are similar to those of the liquid crystal display apparatus 1 according to Embodiment 1, so that repeated explanations on those similar constituting elements will be omitted. FIGS. 6A to 6C show the TFT 3a formed based on the same design, and FIG. 6A shows an example in which a first electrode 7 and a second electrode 8 are formed at the designed regular position. On the other hand, each of FIGS. 6B and 6C shows an example in which the both electrodes are formed such that they are displaced in position upward or downward on each of the figures with respect to a semiconductor layer 6 at the time of manufacturing.

As shown in FIGS. 6A to 6C, also in the present embodiment, the first electrode 7 partially covers each of a first side 61 and a second side 62 of the semiconductor layer 6. Therefore, in the same manner as the previously-described Embodiment 1, variations in a plurality of TFTs 3 of a parasitic capacitance Cgd between the drain electrode (the first electrode 7) and a gate electrode 4 of the TFT 3a can be reduced, and it is possible to reduce display non-uniformity. Moreover, the semiconductor layer 6 has a planar shape being rectangular in planar view, and a planar shape being substantially square in the example in FIG. 6A in particular. In other words, the planar shape of the semiconductor layer 6 comprises, in addition to the first side 61 and the second side 62, a third side 63 that faces the first side 61 and a fourth side 64 that faces the second side 62 in planar view. Then, the second electrode 8 partially covers each of the third side 63 and the fourth side 64 of the semiconductor layer 6. Specifically, in the examples in FIGS. 6A to 6C, the second electrode 8 has a rectangular shape over the gate electrode 4, and an outer edge (a second outer side 81) of the second electrode 8 is located outside the semiconductor layer 6 with respect to the third side 63, where the outer edge is an edge, proximate to the third side 63, of two outer edges of the second electrode 8, and the two outer edges are edges that do not cross the third side 63 of the semiconductor layer 6.

The second electrode 8 has a planar shape comprising, in planar view, a second facing side 80 that faces the first electrode 7; and a second outer side 81 extending substantially parallel to the third side 63 of the semiconductor layer 6 from an end of the second facing side 80, where the end of the second facing side 80 is located outside the semiconductor layer 6. The second outer side 81 is positioned at the outside of the semiconductor layer 6 between the semiconductor layer 6 and an outer edge 42 of the gate electrode 4 being proximate to the third side 63 of the semiconductor layer 6, and is located at a position overlapping the gate electrode 4 not via the semiconductor layer 6. In other words, the second outer side 81 of the second electrode 8 is arranged outside the semiconductor layer 6 with respect to the third side 63 of the semiconductor layer 6.

As described previously, a relative positional deviation can occur between the first electrode 7 and the semiconductor layer 6 at the time of manufacturing. The first electrode 7 and the second electrode 8 can be formed simultaneously by etching using a single mask from one metal layer formed over the semiconductor layer 6, and is preferably formed efficiently by using such a method. Therefore, the second electrode 8 can also have a positional deviation with respect to the semiconductor layer 6 and can have a positional deviation occurring in conjunction with the positional deviation of the first electrode 7. In the conventional TFT 103 in FIG. 9 previously referred to, even if the drain electrode 107 and the source electrode 108 positionally deviate conjunctively on the semiconductor layer 106, the channel Ch itself hardly changes, so that a major problem is unlikely to occur.

However, in the previously-described Embodiment 1, when a positional deviation of the first and second electrode 7, 8 occurs in the up-down direction in FIG. 2, for example, the length of a portion, which is located on the semiconductor layer 6, of the first facing side 70 of the first electrode 7 changes. Therefore, a substantial channel width of a channel Ch fluctuates. When the channel width fluctuates, the amount of charges that can be accumulated in the auxiliary capacitance Cs (FIG. 1) during the ON period of the TFT 3 fluctuates, so that, as a result, the pixel voltage Vd (see FIG. 8) can fluctuate to cause deterioration in display quality. Especially, in recent years, with high definition of the liquid crystal display apparatus, the ON period of the TFT tends to be shorter, so that the fluctuation of the channel width affecting the charging performance of the auxiliary capacitance Cs is likely to cause a problem.

With respect to such an issue, in the TFT 3a according to Embodiment 2, the second electrode 8 partially covers each of the third side 63 and the fourth side 64 of the semiconductor layer 6, so that, even when the first and second electrodes 7, 8 are formed in the state as shown in FIG. 6B or 6C with a positional deviation occurring upward or downward in FIG. 6A, deterioration in display quality does not occur substantially. Describing in detail, lengths W1, W2 of portions, which are located on the semiconductor layer 6, of the first facing side 70 of the first electrode 7 and the second facing side 80 of the second electrode 8 change as shown in FIGS. 6B and 6C with the positional deviation of the first and second electrodes 7, 8, respectively. However, the sum of the lengths (W1+W2) does not change so long as a first outer side 71 of the first electrode 7 is located outside the semiconductor layer 6 and the second outer side 81 of the second electrode 8 is located outside the semiconductor layer 6. Therefore, the area in planar view of the channel Ch and the substantial channel width thereof do not fluctuate and, therefore, deterioration in display quality is also unlikely to occur.

In the planar view shown in FIG. 6A, an interval P1 between the first outer side 71 of the first electrode 7 and the first side 61 of the semiconductor layer 6 and an interval P2 between the second outer side 81 of the second electrode 8 and the third side 63 of the semiconductor layer 6 are, preferably, substantially the same. Therefore, as previously described with respect to the first electrode 7, the interval P2 between the first outer side 71 of the second electrode 8 and the third side 63 of the semiconductor layer 6 is, for example, greater than or equal to 1 μm and less than or equal to 2 μm, and preferably 1.5 μm. With respect to the first and second electrodes 7, 8, it is estimated that a positional deviation can occur with substantially the same probability in both the upward and downward directions in FIG. 6A. Therefore, it is possible to reduce an occurrence of display non-uniformity by setting the intervals P1, P2 to have substantially the same length with each other.

In the examples in FIG. 6A to 6C, the planar shape of the semiconductor layer 6 has a rectangular shape, or, in other words, a point-symmetrical shape. In this case, the first electrode 7 and the second electrode 8 can be symmetrical with respect to the center of the semiconductor layer 6 at least inside the gate electrode 4 in planar view. The first electrode 7 and the second electrode 8 being formed in this way bring the intervals P1, P2 to be substantially equal to each other, thus it is possible to reduce an occurrence of display non-uniformity.

A liquid crystal display apparatus according to each of the Embodiments can be manufactured, for example, in a conventional manufacturing method of the liquid crystal display apparatus, by using an exposure mask comprising an appropriate aperture to form the gate electrode 4, the semiconductor layer 6, the first electrode 7, and the second electrode 8 such that each of them along the gist shown in the explanations of each of the Embodiments is formed. The liquid crystal display apparatus according to each of the Embodiments is construed to be not limited at all by the manufacturing method thereof.

CONCLUSION (1) A liquid crystal display apparatus according to one Embodiment of the invention comprises: a TFT substrate comprising a thin-film transistor, and a pixel electrode connected to the thin-film transistor; and a counter substrate comprising a common electrode facing the pixel electrode via a liquid crystal layer, wherein the thin-film transistor comprises: a semiconductor layer being deposited over a gate electrode via a gate insulating layer and having a planar shape comprising a first side and a second side, wherein each of the first side and the second side overlaps the gate electrode in planar view; and a first electrode connected to the pixel electrode, and a second electrode facing the first electrode, wherein each of the first electrode and the second electrode is formed over the semiconductor layer; the first side and the second side are adjacent to each other at a predetermined angle; and the first electrode at least partially covers each of the first side and the second side.

The configuration according to (1) makes it possible to reduce deterioration in display quality due to variations in a parasitic capacitance of a TFT configurating a pixel circuit in a liquid crystal display apparatus.

(2) In the liquid crystal display apparatus according to (1) in the above, the first electrode can be drawn out externally from a region over the gate electrode along a first direction in which the first electrode and the second electrode face each other. In that case, the first electrode and a pixel electrode can be connected in a short path.

(3) In the liquid crystal display apparatus according to (2) in the above, the first side can extend substantially parallel to the first direction, and can be substantially orthogonal to the second side; and the first electrode can partially cover each of the first side and the second side. In that case, the semiconductor layer and the first electrode can be laid out efficiently.

(4) In the liquid crystal display apparatus according to (3) in the above, a width of the first electrode in a direction along the second side can be less than a length of the second side. In that case, it can be possible to prevent the fluctuation amount of the first electrode due to variations from becoming excessively large.

(5) In the liquid crystal display apparatus according to (3) or (4) in the above, the planar shape of the semiconductor layer can further comprise a third side that faces the first side and a fourth side that faces the second side; and the second electrode can partially cover each of the third side and the fourth side. In that case, fluctuation of the substantial channel width of a channel formed in a semiconductor layer can be suppressed, and it is possible to make deterioration in display quality unlikely to occur.

(6) In the liquid crystal display apparatus according to (5) in the above, the first electrode can have a planar shape comprising, in planar view, a first facing side that faces the second electrode; and a first outer side extending substantially parallel to the first side from an end of the first facing side, wherein the end of the first facing side is located outside the semiconductor layer; the second electrode can have a planar shape comprising, in planar view, a second facing side that faces the first electrode; and a second outer side extending substantially parallel to the third side from an end of the second facing side, wherein the end of the second facing side is located outside the semiconductor layer; and an interval between the first side and the first outer side and an interval between the third side and the second outer side can be substantially the same. In that case, an occurrence of display non-uniformity can be reduced further.

(7) In the liquid crystal display apparatus according to any one of (1) to (6) in the above, the planar shape of the semiconductor layer can have a point-symmetrical shape; and the first electrode and the second electrode can be symmetrical with respect to a center of the semiconductor layer at least inside the gate electrode in planar view. In that case, an occurrence of display non-uniformity can be reduced further.

(8) In the liquid crystal display apparatus according to any one of (1) to (7) in the above, in a region toward the first electrode with respect to an intermediate line passing through a middle between the first electrode and the second electrode in planar view, a length of a part of an outer edge of the semiconductor layer and a length of a part of an outer edge of the first electrode can be substantially equal, wherein the part of the outer edge of the semiconductor layer is a part being not covered by the first electrode, and the part of the outer edge of the first electrode is a part overlapping the gate electrode not via the semiconductor layer. In that case, in a case that the first electrode and the semiconductor layer vary in reverse directions with respect to expansion reduction of the area of each thereof, visually recognizable display non-uniformity can be prevented from occurring.

DESCRIPTION OF REFERENCE NUMERALS

1 LIQUID CRYSTAL DISPLAY APPARATUS
2 TFT SUBSTRATE
3, 3a TFT
4 GATE ELECTRODE
5 GATE INSULATING LAYER
6 SEMICONDUCTOR LAYER
61 FIRST SIDE OF SEMICONDUCTOR LAYER
62 SECOND SIDE OF SEMICONDUCTOR LAYER
63 THIRD SIDE OF SEMICONDUCTOR LAYER
64 FOURTH SIDE OF SEMICONDUCTOR LAYER

7 FIRST ELECTRODE (DRAIN ELECTRODE)
70 FIRST FACING SIDE
71 FIRST OUTER SIDE
8 SECOND ELECTRODE (SOURCE ELECTRODE)
80 SECOND FACING SIDE
81 SECOND OUTER SIDE
9 PIXEL ELECTRODE
10 COUNTER SUBSTRATE
11 COMMON ELECTRODE
Cgd PARASITIC CAPACITANCE
Ch CHANNEL
Cs AUXILIARY CAPACITANCE
L1, L1a to L1c LENGTH OF PART OF OUTER EDGE OF FIRST ELECTRODE, WHICH OVERLAPS GATE ELECTRODE NOT VIA SEMICONDUCTOR LAYER
L2, L2a to L2d LENGTH OF PART OF OUTER EDGE OF SEMICONDUCTOR LAYER, WHICH IS NOT COVERED BY FIRST ELECTRODE IN REGION TOWARD FIRST ELECTRODE WITH RESPECT TO INTERMEDIATE LINE
LC LIQUID CRYSTAL LAYER
M INTERMEDIATE LINE
P1 INTERVAL BETWEEN FIRST OUTER SIDE OF FIRST ELECTRODE AND FIRST SIDE OF SEMICONDUCTOR LAYER
P2 INTERVAL BETWEEN SECOND OUTER SIDE OF SECOND ELECTRODE AND THIRD SIDE OF SEMICONDUCTOR LAYER

The invention claimed is:

1. A liquid crystal display apparatus comprising:
a thin-film transistor (TFT) substrate comprising a thin-film transistor, and a pixel electrode connected to the thin-film transistor; and
a counter substrate comprising a common electrode facing the pixel electrode via a liquid crystal layer, wherein
the thin-film transistor comprises:
a semiconductor layer being deposited over a gate electrode via a gate insulating layer and having a planar shape comprising a first side and a second side, wherein each of the first side and the second side overlaps the gate electrode in planar view; and
a first electrode connected to the pixel electrode, and a second electrode facing the first electrode, wherein each of the first electrode and the second electrode is formed over the semiconductor layer;
the first side and the second side are adjacent to each other at a predetermined angle;
the first electrode partially covers each of the first side and the second side;
the first side extends substantially parallel to a first direction in which the first electrode and the second electrode face each other, and is substantially orthogonal to the second side;
the planar shape of the semiconductor layer further comprises a third side that faces the first side and a fourth side that faces the second side; and
the second electrode partially covers the fourth side and covers neither the first side nor the third side.

2. The liquid crystal display apparatus according to claim 1, wherein the first electrode is drawn out externally from a region over the gate electrode along the first direction.

3. The liquid crystal display apparatus according to claim 1, wherein a width of the first electrode in a direction along the second side is less than a length of the second side.

4. The liquid crystal display apparatus according to claim 1, wherein the first electrode is drawn out externally from a region over the gate electrode along a second direction being substantially orthogonal to the first direction.

5. A liquid crystal display apparatus comprising:
a thin-film transistor (TFT) substrate comprising a thin-film transistor, and a pixel electrode connected to the thin-film transistor; and
a counter substrate comprising a common electrode facing the pixel electrode via a liquid crystal layer, wherein
the thin-film transistor comprises:
a semiconductor layer being deposited over a gate electrode via a gate insulating layer and having a planar shape comprising a first side and a second side, wherein each of the first side and the second side overlaps the gate electrode in planar view; and
a first electrode connected to the pixel electrode, and a second electrode facing the first electrode, wherein each of the first electrode and the second electrode is formed over the semiconductor layer;
the first side and the second side are adjacent to each other at a predetermined angle;
the first electrode partially covers each of the first side and the second side;
the planar shape of the semiconductor layer further comprises a third side that faces the first side and a fourth side that faces the second side; and
the second electrode partially covers each of the third side and the fourth side.

6. The liquid crystal display apparatus according to claim 5, wherein
the first electrode has a planar shape comprising, in planar view, a first facing side that faces the second electrode; and a first outer side extending substantially parallel to the first side from an end of the first facing side, wherein the and of the first facing side is located outside the semiconductor layer;
the second electrode has a planar shape comprising, in planar view, a second facing side that faces the first electrode; and a second outer side extending substantially parallel to the third side from an end of the second facing side, wherein the end of the second facing side is located outside the semiconductor layer; and
an interval between the first side and the first outer side and an interval between the third side and the second outer side are substantially the same.

7. The liquid crystal display apparatus according to claim 5, wherein
the planar shape of the semiconductor layer has a point-symmetrical shape; and
the first electrode and the second electrode are symmetrical with respect to a center of the semiconductor layer at least inside the gate electrode in planar view.

8. The liquid crystal display apparatus according to claim 5, wherein
the first side extends substantially parallel to a first direction in which the first electrode and the second electrode face each other, and is substantially orthogonal to the second side.

9. The liquid crystal display apparatus according to claim 8, wherein a width of the first electrode in a direction along the second side is less than a length of the second side.

10. The liquid crystal display apparatus according to claim 5, wherein the first electrode is drawn out externally from a region over the gate electrode along a first direction in which the first electrode and the second electrode face each other.

11. The liquid crystal display apparatus according to claim 5, wherein the first electrode is drawn out externally from a region over the gate electrode along a second direction being substantially orthogonal to a first direction in which the first electrode and the second electrode face each other.

12. A liquid crystal display apparatus comprising:
   a thin-film transistor (TFT) substrate comprising a thin-film transistor, and a pixel electrode connected to the thin-film transistor; and
   a counter substrate comprising a common electrode facing the pixel electrode via a liquid crystal layer, wherein the thin-film transistor comprises:
      a semiconductor layer being deposited over a gate electrode via a gate insulating layer and having a planar shape comprising a first side and a second side, wherein each of the first side and the second side overlaps the gate electrode in planar view; and
      a first electrode connected to the pixel electrode, and a second electrode facing the first electrode, wherein each of the first electrode and the second electrode is formed over the semiconductor layer;
      the first side and the second side are adjacent to each other at a predetermined angle;
      the first electrode at least partially covers each of the first side and the second side; and
      in a first region toward the first electrode with respect to an intermediate line passing through a middle between the first electrode and the second electrode in planar view, a length of a first part of an outer edge of the semiconductor layer in the first region and a length of a second part of an outer edge of the first electrode are substantially equal, wherein
   the first part is a part being uncovered with the first electrode, and
   the second part is a part overlapping the gate electrode without the semiconductor layer between the gate electrode and the outer edge of the first electrode.

* * * * *